United States Patent [19]
Yoshitomi et al.

[11] Patent Number: 5,969,338
[45] Date of Patent: Oct. 19, 1999

[54] LIGHT-RECEIVED POSITION DETECTING CIRCUIT AND DISTANCE DETECTING APPARATUS USING THE SAME

[75] Inventors: Tetsuya Yoshitomi; Takashi Someya, both of Osaka; Akira Ito, Chiba, all of Japan

[73] Assignees: Sanyo Electric Co., Ltd., Osaka, Japan; Seiko Precision Inc., Chiba, Japan

[21] Appl. No.: 09/040,339

[22] Filed: Mar. 18, 1998

[51] Int. Cl.$^6$ ........................................................ G01V 9/04
[52] U.S. Cl. ................. 250/221; 250/214 R; 250/559.38; 250/214 P
[58] Field of Search ................................. 250/221, 214 R, 250/214 LS, 214 P, 559.38; 356/3, 3.12, 3.08, 221, 222; 327/516

[56] References Cited

U.S. PATENT DOCUMENTS 3,649,122  3/1972  Holtz ..................................... 250/208.6

*Primary Examiner*—Que T. Le
*Attorney, Agent, or Firm*—Armstrong, Westerman, Hattori, Mcleland & Naughton

[57] ABSTRACT

A light-received position detecting circuit includes a light receiving portion 10 formed by plural photodiodes arranged side by side for detecting light to generate a photoelectric current, and a resistor group RR formed by plural resistors RR1 to RRn-1 connected in series and the photodiodes are correspondingly connected to the respective resistors to divide the photoelectric current from a light emitting portion 31 into photoelectric current parts according to the position of generation of the photoelectric current. First and second current detecting amplifiers 12 and 16 for generating detection signals corresponding to the photoelectric current parts are connected to the opposite ends of the resistor group RR, respectively. A third current detecting amplifier 14 for dividing the light receiving portion 10 into light receiving sections and detecting the photoelectric current part is connected to selected one of the resistors located in the intermediate portion of the resistor group RR. The operation of the amplifier 14 is changed over selectively by a switch 18.

7 Claims, 6 Drawing Sheets

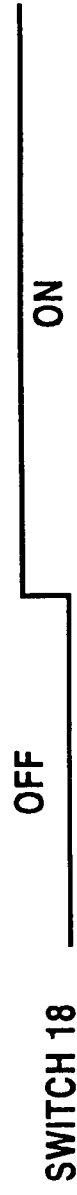
FIG.5A  I_RED
FIG.5B  SWITCH 18
FIG.5C  OUTPUT OF AMP. 12
FIG.5D  OUTPUT OF AMP. 16
FIG.5E  OUTPUT OF AMP. 14

LIGHT-RECEIVED POSITION DETECTING CIRCUIT AND DISTANCE DETECTING APPARATUS USING THE SAME

BACKGROUND OF THE INVENTION

1. Field of the Invention

The present invention relates to a circuit for detecting a light-received position in a light receiving portion such as, for example, a light-received position detecting circuit to be used in a distance detecting apparatus for automatically focusing in a camera.

2. Description of the Related Art

In a distance detecting apparatus used for an automatically focusing function in a camera or the like, conventionally, a position sensitive light detector (PSD) is used a discrete part.

FIG. 7 shows the schematic configuration of a part of a distance detecting apparatus using such a PSD 50. The PSD 50 is a semiconductor element for converting received light into a photoelectric current part by using a pn junction formed in a semiconductor substrate. A pair of electrodes (not shown) each for taking out a photoelectric current part are formed on the opposite ends of the PSD 50. An internal resistance having a predetermined resistance value formed by a p- or n-layer of the semiconductor is present between the electrodes so as to divide a photoelectric current generated in the PSD 50 into photoelectric current parts according to the position where the photoelectric current is generated. The photoelectric current parts are taken out from the electrodes on the opposite ends, respectively. The photoelectric current parts taken out from the respective electrodes are inversely proportional to the distances from the position of generation of the photoelectric current to the electrodes respectively. Amplifiers 52 and 54 with their input terminals connected to the respective electrodes compare the photoelectric current parts taken out from the respective electrodes with a reference voltage $V_{ref}$ to thereby generate predetermined detection signals respectively. Output terminals of the amplifiers 52 and 54 are connected to two input terminals of an amplifier 56 so that the amplifier 56 compares the output signals of the respective amplifiers 52 and 54 to thereby generate a predetermined detection signal. A not-shown arithmetic operation portion calculates the light-received position on the PSD 50 on the basis of the detection signal generated by the amplifier 56.

For example, in a distance detecting apparatus in a camera, or the like, light is radiated from a not-shown light emitting portion to a target such as a subject or the like, the position of the PSD 50 where the light reflected from the target enters is detected, and the distance from the camera to the target is calculated on the basis of the detected light-received position. Further, the lens position of the camera is moved in accordance with the detected distance to thereby perform the focusing of the camera.

In the PSD 50, however, there was such a problem that the photoelectric current part generated by light reception was so small (for example, an order of n A) that the photoelectric current part was easily affected by external noise. Especially, because the PSD 50 was configured as a discrete part, there was a high possibility that external noise was superimposed on signals in the wiring paths from the opposite ends of the PSD 50 to the amplifiers 52 and 54 respectively. In order to reduce such an influence of noise, it was thought of a method of increasing the gain of the amplifiers 52 and 54. In such a method, however, the noise level became high as the gain increased so that it was impossible to improve the S-N ratio.

Further, it was thought of a method in which the PSD 50 and the amplifiers 52 and 54 were provided, for example, as an integrated circuit to make the wiring paths short. In this case, however, the production of the internal resistance of the PSD 50 was under restrictions (particularly, impurity concentration) in process of producing semiconductor devices such as transistors, etc. so that an internal resistance having a desired resistance value necessary for detecting a very small photoelectric current part could not be easily formed. Accordingly, this method was not practical.

In a light-received position detecting circuit using such a PSD 50, conventionally, the wiring paths for the PSD 50 to the respective amplifiers 52 and 54 were made as short as possible and the wirings were shielded so that the effects of the noise was reduced to keep necessary accuracy in detecting the light-received position. There was therefore such a problem that the degree of freedom was limited in apparatus design, the assembling cost was high, and so on.

Further, in order to improve the accuracy in distance detection, the light-received position detecting operation was repeated many times, and the obtained values of the light-received position or the detected values of the distance to the target were averaged. Accordingly, there was such a problem that it took a long time for distance detection.

SUMMARY OF THE INVENTION

The present invention has been made to solve the above problems with the prior art, and therefore an object of the present invention is to provide a light-received position detecting circuit and a distance detecting apparatus which can prevent the influence of external noise and which makes it possible to detect the light-received position or distance in a short time and with high accuracy.

In order to achieve the above object, the light-received position detecting circuit according to the present invention is characterized as follows.

The light-received position detecting circuit comprises: a light receiving portion in which a plurality of light detecting elements each for detecting light to generate a photoelectric current part are disposed side by side; a resistor group in which resistors are connected in series and connected to the light detecting elements respectively correspondingly for dividing a photoelectric current part from the light receiving portion into photoelectric current parts in accordance with the position where the photoelectric current part is generated; and first and second current detecting means connected to opposite ends of the resistor group respectively to thereby generate detection signals respectively in accordance with the photoelectric current parts supplied thereto through the resistor group; whereby a light-received position of the light receiving portion is detected on the basis of the detection signals generated by the first and second current detecting means.

Thus, according to the present invention, the photoelectric current part generated in response to light reception by the plurality of light detecting elements arranged side by side is divided into photoelectric current parts in accordance with the position of generation of the photoelectric current part by means of the separately provided resistor group. The resistance values of the series-connected resistors constituting the resistor group can be set desirably with no specific restriction in production process of the light detecting elements. Accordingly, it is possible to form the configurations of parts of the light-received position detecting circuit in one and the same substrate into the form of one chip configuration. Thus, the wiring distance from the light receiving portion to the current detecting means can be made extremely short and it becomes easy to electrically shield the wiring paths, so that the photoelectric current part detecting accuracy, that is, the light-received position detecting accuracy can be improved extremely.

Further, according to the present invention, a third current detecting means is connected to one of the resistors disposed at an intermediate portion of the resistor group to thereby divide the light receiving portion into a plurality of light receiving sections.

Further, the light receiving sections divided by the third current detecting means are made uneven in length, so that the light-received position detecting accuracy in the light receiving section shorter in length can be made higher than that in the light receiving section longer in length.

Further, the present invention is characterized in that there is provided a switch for desirably switching the state of the third current detecting means between detecting operation and operation stop. Thus, by changing over the operation of the third current detecting means, the light receiving portion can be divided selectively.

Each of the resistors of the resistor group is constituted by an impurity-diffused resistor formed in a semiconductor substrate. Accordingly, there is no scattering in ratio among the resistance values of the respective resistors and the resistance values can be set easily desirably.

In the light-received position detecting method using the above-mentioned light-received position detecting circuit, the third current detecting means is made to be in a state of the operation stop by means of the switch and a light-received region in the light receiving portion is judged on the basis of the detection signals from the first and second current detecting means. Next, the third current detecting means is made to be a state of the detecting operation by means of the switch, and the light-received position of the light receiving portion is obtained on the basis of the detection signals from the third current detecting means and either one of the first and second current detecting means disposed at the opposite ends of a light receiving section which is one of a plurality of light receiving sections obtained by dividing the light receiving portion and to which the light-received region belongs.

A distance detecting apparatus using the above-mentioned light-received position detecting circuit further comprises: a light emitting portion disposed with a predetermined optical positional relation with the light receiving portion for emitting light toward a target, a light condensing means for condensing light which is emitted from the light emitting portion and returned through the target to thereby lead the light to the light receiving portion, and an arithmetic operation portion for calculating a distance from the light emitting portion to the target, whereby the distance from the light emitting portion to the target is detected by using a distance from a predetermined reference position in the light receiving portion to the light-received position in the light receiving portion and an optical distance between the light emitting portion and the condensing means. If the distance to the target is obtained by using the light-received position detecting circuit with extreme high position detecting accuracy, the reliability on the detected distance is high and the light-received position can be detected in a short time so that the time required for distance detection can be reduced greatly.

The above and other objects and features of the present invention will be more apparent from the following description taken in conjunction with the accompanying drawings.

BRIEF DESCRIPTION OF THE DRAWINGS

In the drawings:

FIGS. 4A to 4E are views showing a method of detecting the light-received position in a light receiving portion depicted in FIG. 1;

FIGS. 5A to 5E are views showing a method of driving the light-received position detecting circuit according to the embodiment of the present invention;

DETAILED DESCRIPTION OF THE PREFERRED EMBODIMENTS

Figure 1:
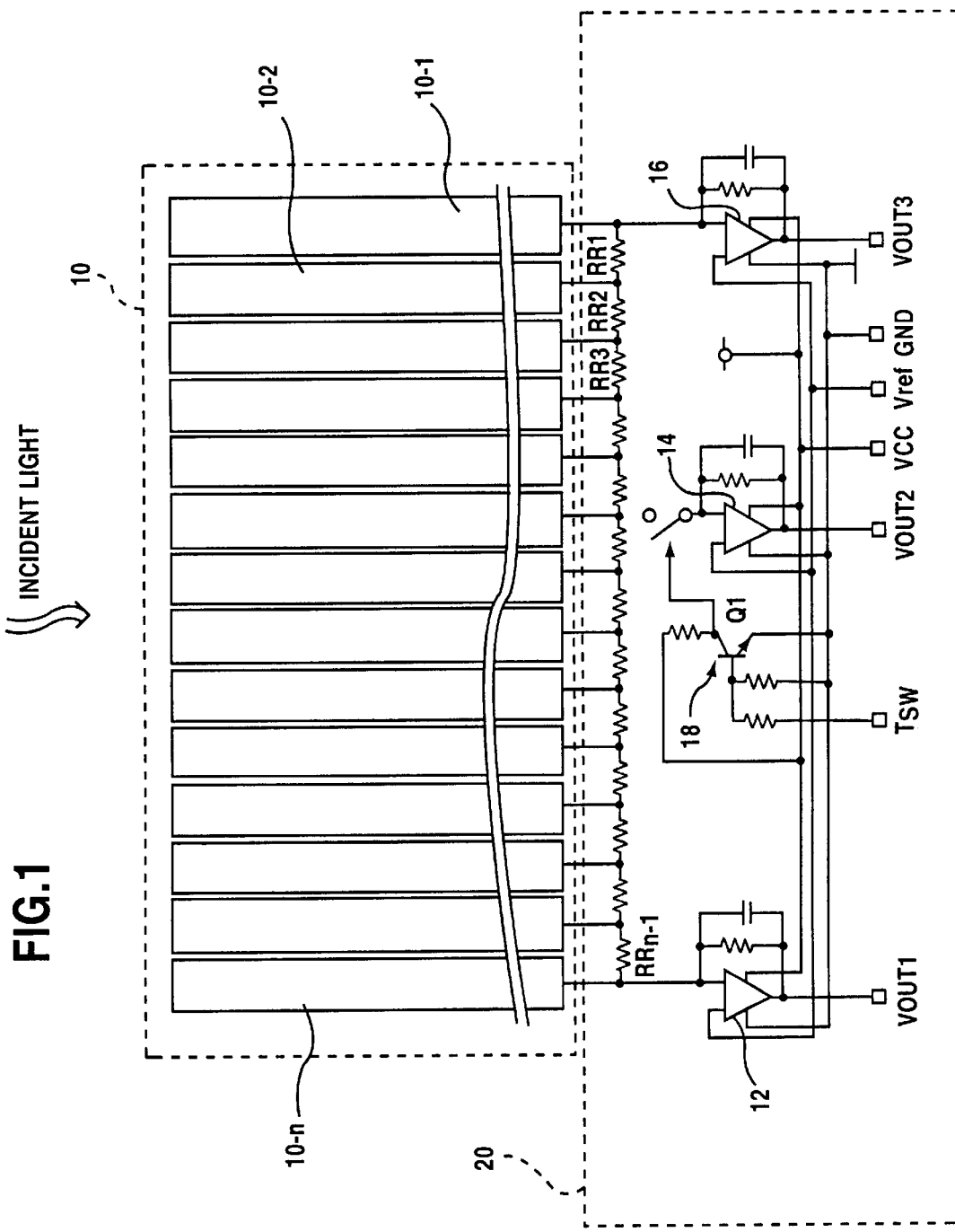
FIG. 1 is a view showing the configuration of a light-received position detecting circuit according to an embodiment of the present invention.

Now, a description will be given in more detail of preferred embodiments of the present invention with reference to the accompanying drawings. In the drawings which will be described later, like parts are referenced correspondingly.

Configuration of Light-Received Position Detecting Circuit

FIG. 1 shows the configuration of a light-received position detecting circuit according to an embodiment of the present invention. In the drawing, a light receiving portion 10 is constituted by a plurality of strip-shaped photodiodes (PD) 10-1 to 10-n which are arranged side by side at predetermined intervals. Incidentally, in the case where this light receiving portion 10 is used in place of a PSD, the total light receiving area of the light receiving portion 10 constituted by the plurality of photodiodes 10-1 to 10-n is made to be substantially equal to the light receiving area of the PSD.

A resistor group RR is constituted by a plurality of resistors RR1 to RRn-1 which are connected in series to each other. The photodiodes 10-1 to 10-n are connected to the resistors RR1 to RRn-1 respectively correspondingly.

One input terminals of first and second current detecting amplifiers 12 and 16 are connected to opposite ends of the resistor group RR respectively. Incidentally, each of these amplifiers 12 and 16 is a current-to-voltage converting circuit for converting a micro photoelectric current, from the light receiving portion 10, into a voltage signal to thereby detect the photoelectric current part. Further, a one input terminal of a third current detecting amplifier 14 is connected to a predetermined one of the resistors which is located in an intermediate portion of the resister group RR. This third current detecting amplifier 14 divides the resister group RR into sections, that is, divides the light receiving portion 10 into light receiving sections, so that the third current detecting amplifier 14 converts a photoelectric current part generated in each light receiving section into a voltage signal similarly to the other amplifiers 12 and 16. Further, a switch 18 which is, for example, constituted by an npn-type transistor Q1 is connected to the third current detecting amplifier 14.

For example, the switch 18 selectively close/open the connection between the resister group and the one input terminal of the third current detecting amplifier 14 in accordance with a predetermined control signal supplied to a switch terminal TSW from a control portion of a microcomputer, or the like, which will be described later. By the open/close operation of the switch 18, the current detecting operation of the third current detecting amplifier 14 is controlled.

Sets of parallel connections each constituted by a resistor and a capacitor are connected respectively between the one input terminals and output terminals VOUT1 to VOUT3 of the amplifiers 12, 14 and 16. A common reference electric supply (Vref) is connected to each of the other input terminals of the amplifiers 12, 14 and 16. Further, each of the amplifiers 12, 14 and 16 is provided so as to operate between a common electric supply (VCC) and the ground (GND).

If any one of the plurality of photodiodes 10-1 to 10-n receives light and generates a photoelectric current, the generated photoelectric current part is divided into parts by the resister group RR in accordance with the position of generation of the photoelectric current part. If the photoelectric current parts from the light receiving portion 10 are supplied to the one input terminals of the current detecting amplifiers 12, 14 and 16 respectively, the current detecting amplifiers 12, 14 and 16 compare these photoelectric current parts with the reference voltage Vref supplied to the other-input terminals of the amplifiers 12, 14 and 16 and generate predetermined detection signals corresponding to the photoelectric current parts. The predetermined detection signals are outputted through the output terminals VOUT1 to VOUT3, respectively.

Figure 2:
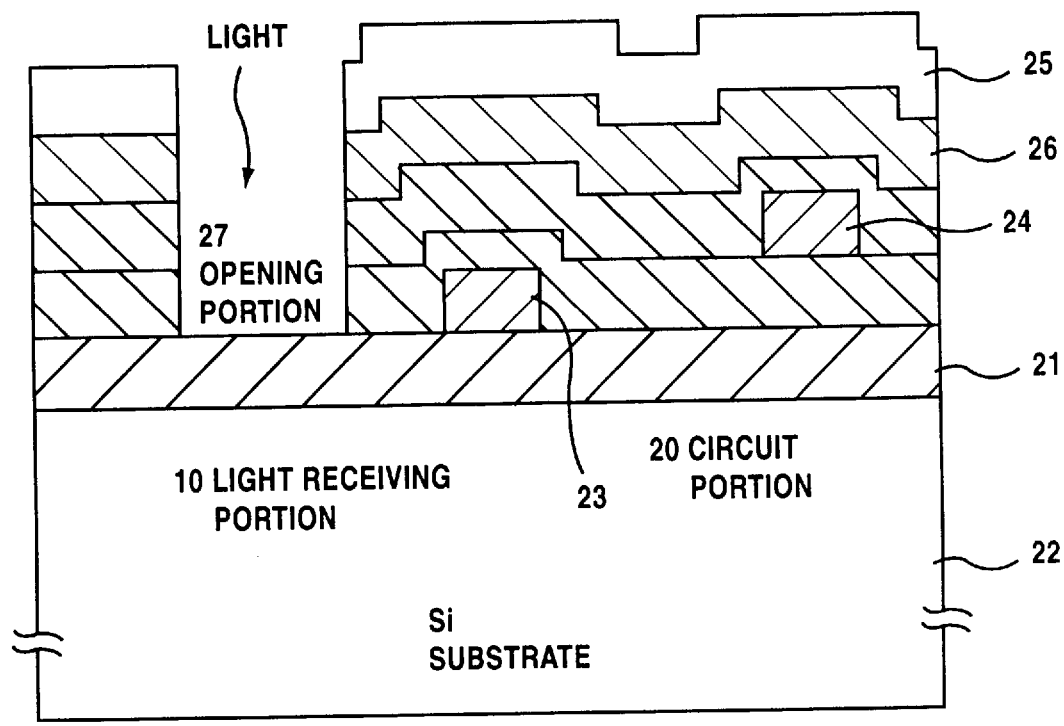
FIG. 2 is a schematic sectional view of the light-received position detecting circuit depicted in FIG. 1.

FIG. 2 is a schematic sectional view of the light-received position detecting circuit depicted in FIG. 1. As shown in FIG. 2, the light receiving portion 10 constituting the light-received position detecting circuit and a circuit portion 20 constituted by the resister group RR, the current detecting amplifiers 12, 14 and 16, etc. are formed in one and the same semiconductor substrate 22.

The respective photodiodes 10-1 to 10-n are formed from pn junctions in the semiconductor substrate. On the other hand, the resistor group RR is constituted by impurity diffused resistors, or the like, formed in the same substrate. The resistance values of the respective resistors RR1 to RRn-1 of the resistor group RR can be selected desirably by changing the areas of the diffused resistors in the semiconductor substrate. Further, because the resistors RR1 to RRn-1 are formed by one and the same step and in one and the same region portion of the substrate, variation in the resistance values of the resistors RR1 to RRn-1 is suppressed to be extremely small.

An $SiO_2$ layer 21 is formed over the whole surface of the substrate 22. An opening portion 27 is formed in a region of the light receiving portion 10 in the $SiO_2$ layer 21. On the other hand, metal wiring layers 23 and 24 of the circuit portion 20 are formed in a region of the circuit portion 20 so as to be separated from each other by an interlayer electrically insulating layer. Further, a light shielding layer 26 is formed as an upper layer of the wiring layer 24 so that the region where the circuit portion 20 is formed is covered with the light shielding layer 26 through the interlayer electrically insulating layer. The region where the circuit portion 20 is formed is shaded by the light shielding layer 26, so that light from the outside is radiated only onto the light receiving portion 10. Further, the light shielding layer 26 is formed from a metal material and connected to the electric supply (VCC) or the ground (GND) so that the light shielding layer 26 serves also as a shielding layer against external noise. Further, a jacket layer 25 is formed on the light shielding layer 26 so that the jacket layer 25 serves as a protection layer.

Configuration of Distance Detecting Apparatus

Figure 3:
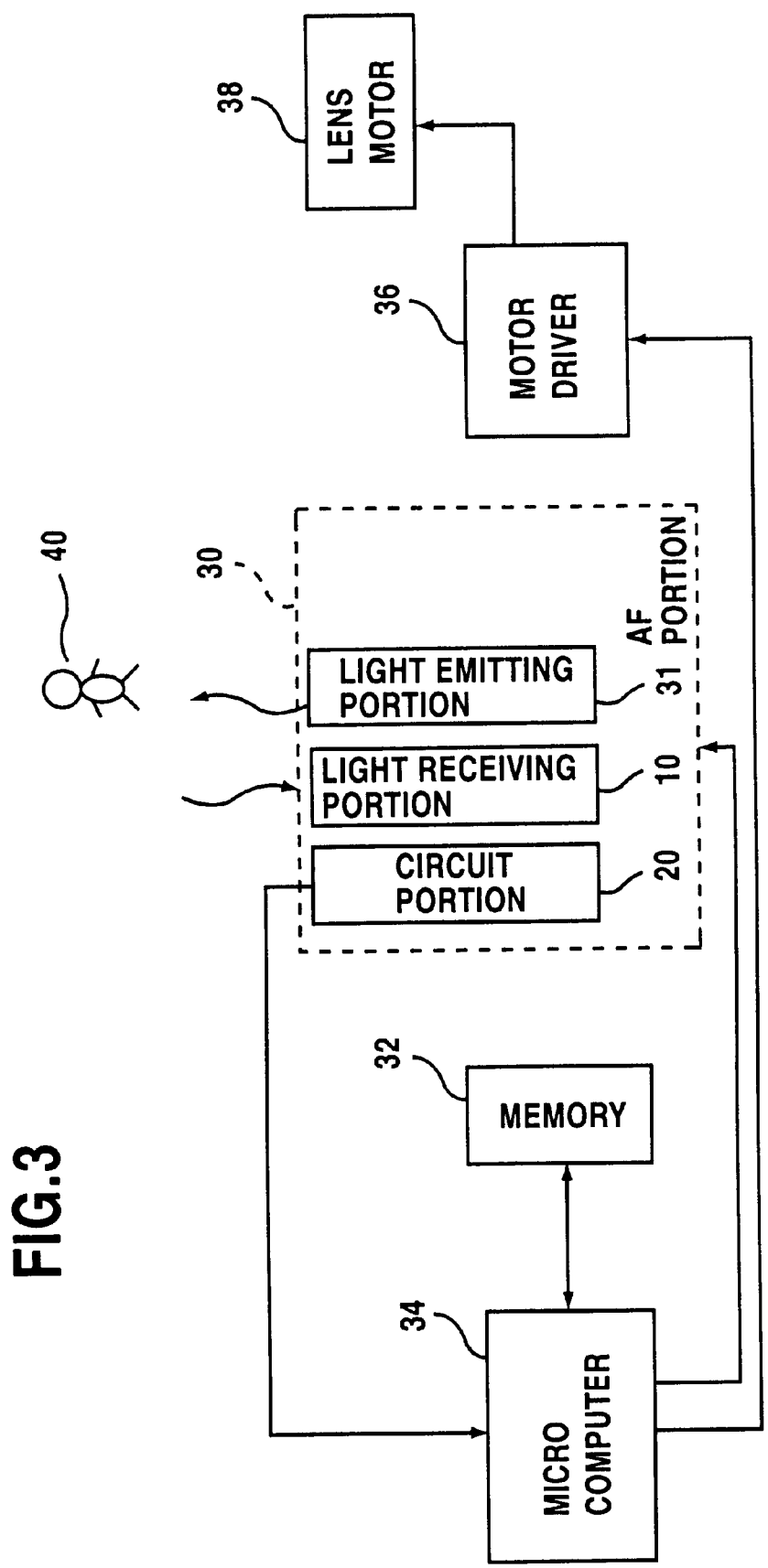
FIG. 3 is a view showing the configuration of a camera using the light-received position detecting circuit according to the embodiment of the present invention.

FIG. 3 shows an example of the configuration of a camera having a distance detecting apparatus using the light detection circuit depicted in FIG. 1. A light emitting portion 31 for emitting infrared light and the light receiving portion 10 form a part of an autofocussing, (AF) portion 30. The light emitting portion 31 and the light receiving portion 10 are arranged to have a predetermined optical positional relation with each other so that infrared light emitted from the light emitting portion 31 is reflected by a subject 40 and then incident onto the light receiving portion 10.

When light emitted from the light emitting portion 31 enters a predetermined position of the light receiving portion 10, the photoelectric current from the light-received photodiode is divided into parts by the resistor group RR in accordance with the light-received position so that the current parts are detected by the current detecting amplifiers 12, 14 and 16, respectively. The current detecting amplifiers 12, 14 and 16 respectively supply output detection signals in accordance with the photoelectric current parts from the light receiving portion 10 to the microcomputer 34. Further, the microcomputer 34 determines the light-received position, that is, the position of the light-received one of the photodiodes 10-1 to 10-n on the basis of the detection result obtained from the current detecting amplifiers 12, 14 and 16 and calculates the distance from the camera to the subject 40 on the basis of the determined position by using a method which will be described later. Further, the microcomputer 34 supplies a predetermined drive signal to a motor driver 36 on the basis of the calculated distance.

The motor driver 36 drives a lens motor 38 on the basis of the drive signal, by which the position of a lens is changed so that the camera is focussed on the subject in accordance with the distance between the camera and the subject. Incidentally, in the drawing, a memory 32 stores calculation contents, results, etc. obtained by the microcomputer 34.

Method of Detecting Light-Received Position

Further, referring to FIGS. 4A to 4E, an example of the light-received position detecting method in the light receiving portion 10 in this embodiment of the present invention will be described below. Incidentally, FIGS. 4A to 4E show relations between photoelectric current parts detected by the current detecting amplifiers 12, 16 and 14 depicted in FIG. 1 and the position where light is received by the light receiving portion 10.

In the case where the photoelectric current parts are detected by the amplifiers 12 and 16 without use of the third current detecting amplifier 14, the photoelectric current part detected by the amplifiers 12 and 16 is inversely proportional to the distance between the light-received position and each of the amplifiers 12 and 16 as shown in FIG. 4B. As a result, the photoelectric current is smaller as the light-received position of the light receiving portion 10 is separated from the amplifier 12 or 16. For example, when the light-received position in the light receiving portion 10 is [β] in the drawing, the photoelectric current part detected by the amplifier 16 is larger than the photoelectric current part detected by the amplifier 12 because the amplifier 16 is nearer to the light-received position than the amplifier 12.

Accordingly, being supplied with detection signals corresponding to the photoelectric current parts from the amplifiers 12 and 16, the light-received position calculating portion, for example, the microcomputer 34 depicted in FIG. 3, can determine the light-received position in the light receiving portion 10 on the basis of the detection signals.

Figure 4A:
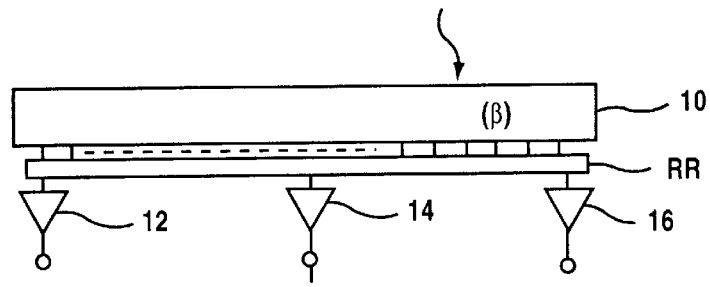
Figure 4C:
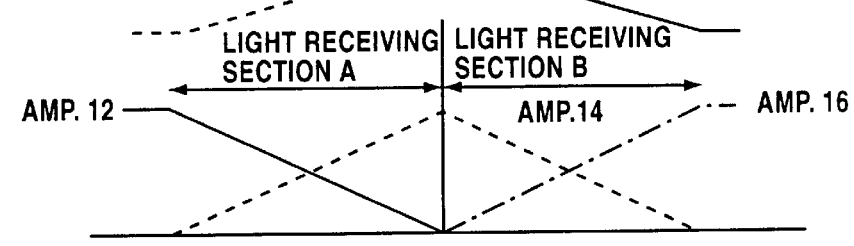

In this embodiment, as described above, the third current detecting amplifier 14 is connected to the intermediate portion of the resistor group RR in FIG. 1 in order to increase the accuracy in detection of the light receiving portion more greatly. In the case where this amplifier 14 is connected, by control of the switch 18 of FIG. 1, to a center one of the resistors of the resistor group RR as shown in FIG. 4A, the resistor group, that is, the light receiving portion 10 is divided into two sections A and B by the amplifier 14 located in the center so that photoelectric current parts detected by the amplifiers 12, 14 and 16 are as shown in FIG. 4C. Specifically, in FIG. 4C, the dot line shows a photoelectric current part detected by the amplifier 14, the solid line shows a photoelectric current part detected by the amplifier 12, and the dot-and-dash line shows a photoelectric current part detected by the amplifier 16. Further, as shown in FIG. 4C, the amplifiers 12 and 14 detect photoelectric current parts generated in the section A and the amplifiers 14 and 16 detect photoelectric current parts generated in the section B. If a plurality of amplifiers are provided, for example, if the third current detecting amplifier 14 is provided to divide the light receiving region into sections as described above. For example, when the lengths of the sections A and B are substantially equal to each other, the length of the section to be detected by each of the amplifiers 12 and 16 becomes substantially half. Accordingly, the detection accuracy in each of the amplifiers 12 and 16 corresponding to the change of the light-received position in the light receiving portion 10 is increased to be about twice compared with the case of FIG. 4B. Accordingly, the received light detecting accuracy can be improved more greatly.

Figure 4E:
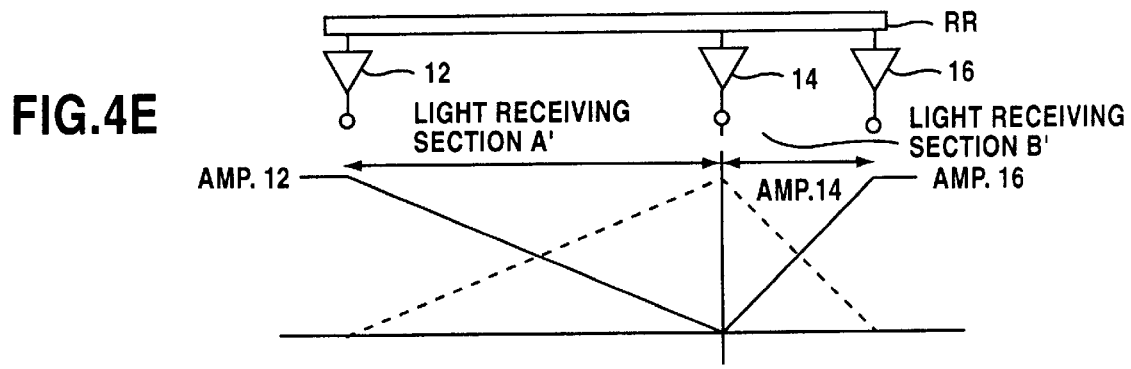

Further, FIG. 4D shows an another example of the location of the third current detecting amplifier 14. In FIG. 4D, the light receiving portion 10 is divided by the amplifier 14 into light receiving sections A' and B' which are uneven in length. The shorter one (B' in the drawing) of the light receiving sections A' and B' is higher in accuracy in detection of photoelectric current parts in amplifiers than the other section as shown in FIG. 4E. That is, the position detecting accuracy for the shorter section is higher. Accordingly, in the case where a region in the light receiving portion 10 requires higher position detecting accuracy, the requirement for detection accuracy can be satisfied by setting the region to be a shorter section.

For example, in autofocussing of a camera, accuracy in focussing for a subject 40 at a short distance is required to be higher than accuracy in focussing for a subject 40 at a long distance. Further, light obtained from a subject 40 near to the camera enters a predetermined section of the light receiving portion 10 as will be described later. Therefore, the amplifier 14 is disposed so that the section length of the region where light from the subject 40 at a short distance enters is shortened. In such a manner, the light-received position where light from the subject 40 at a short distance is detected in a short section, so that the sensitivity of position detection can be improved particularly in the short distance side.

On the other hand, with the development of a zooming technique in a camera, high accuracy in focussing of a subject 40 at a long distance is also required when a high magnifying power camera lens is used. The photoelectric current part of light reflected by the subject 40 at a long distance is determined so that the photoelectric current part of the received light decreases in inverse proportion to the square of the distance. It is, therefore, necessary to heighten the accuracy in detecting the received light from the subject 40 at a long distance. Further, light obtained from the subject 40 located at a long distance from the camera enters a predetermined section of the light receiving portion 10 as will be described later. Therefore, the amplifier 14 is disposed so as to shorten the section length of the region where light enters from the subject 40 at a long distance. In such a manner, the light-received position of the light from the subject 40 at a long distance can be detected in a short section. Accordingly, the sensitivity of position detection can be heightened on the long distance side.

Although FIGS. 4A to 4E show the case where the amplifier 14 is provided by only one as the third current detecting amplifier, it is a matter of course that the number of the third current detecting amplifiers is not limited to one but a plurality of third current detecting amplifiers may be provided in accordance with the required position detecting accuracy.

The light-received position detecting procedure in which the first, second and third current detecting amplifiers 12, 16 and 14 are used as shown in FIGS. 4A to 4E will be further described below with reference to FIGS. 5A to 5E.

First, the light emitting portion 31 emits infrared light $I_{RED}$ in the form of pulses on the basis of the control signal supplied from the microcomputer 34 in FIG. 3 (see FIG. 5A). The light emitted from the light emitting portion 31 is reflected by the subject 40, and the light returned from the subject 40 is received by the light receiving portion 10. Further, as shown in FIG. 5B, for example, the control signal of "L level" from the microcomputer 34 is supplied to the base of the transistor Q1 which constitute the switch 18, so that the transistor Q1 is turned off. Accordingly, the third current detecting amplifier 14 is disconnected from the resistor group RR so that the amplifier 14 stops its operation. Accordingly, there is no output from the amplifier 14 (see FIG. 5E), so that the first and second current detecting amplifiers 12 and 16 at the opposite ends of the resistor group RR detect the generated photoelectric current parts with the characteristic shown in FIG. 4B.

If the light-received position in the light receiving portion 10 is, for example, [β] in FIG. 4A, the photoelectric current part detected by the amplifier 16 is larger than the photoelectric current part detected by the amplifier 12 as shown in FIGS. 5C and 5D. Accordingly, the detection output of the amplifier 16 is larger than the detection output of the amplifier 12. The microcomputer 34 compares the detection outputs with each other and makes a decision that the light-received position in the light receiving portion 10 is near the amplifier 16, that is, the light receiving region exists in the section B.

As shown in FIG. 5B, the microcomputer 34 then supplies, for example, the control signal of "H level" to the switch 18 at predetermined timing in a period from the first generation of infrared light $I_{RED}$ in the light emitting portion 31 to the second generation of infrared light $I_{RED}$ in the light emitting portion 31 so that the switch 18 is turned on. Accordingly, the amplifier 14 is connected to the resistor group RR, so that the amplifier 14 operates. Accordingly, the light receiving portion 10 is divided into light receiving sections A and B, or A' and B'.

Further, the light emitting portion 31 is controlled by the microcomputer 34 so that the light emitting portion 31 emits infrared light $I_{RED}$ again at the next predetermined timing. With respect to the result of this light reception in the light receiving portion 10, the microcomputer 34 detects the position of the photodiode receiving this light in the section B or B' by referring to the detection signals obtained from the amplifier 16 and 14 associated with the section B or B'.

In such a manner, first, a judgment is made, on the basis of the output results of the amplifiers 12 and 16 at the opposite ends of the resistor group RR, as to whether the light receiving region in the light receiving portion 10 exists in the light receiving section A (A') or in the light receiving section B (B'). The amplifier 14 is then made to operate. Detection outputs from the amplifier 14 and either one of the amplifiers 12 and 16 at the opposite ends of the section decided on the basis of the aforementioned judgment result are judged to thereby detect the position of the photodiode which has received the light in the section. As described above, after the section of the light receiving region is specified, the light-received position in the section is detected. Accordingly, not only the detecting accuracy is improved but also the light-received position can be detected by the minimum detection number of times so that the detection time required for the detection of the sight-received position can be shortened greatly.

Although FIGS. 5A to 5E show the case where the generation of the signal $I_{RED}$ is performed such that one pulse is generated to turn off the switch 18 and one pulse is generated to turn on the switch 18, it is a matter of course that the number of pulses in the generation of the signal $I_{RED}$ is not limited to one for turn-on and off but a plurality of pulses may be generated and averaged in accordance with the required position detecting accuracy to thereby improve the accuracy more greatly.

Distance Detecting Method

Figure 6:
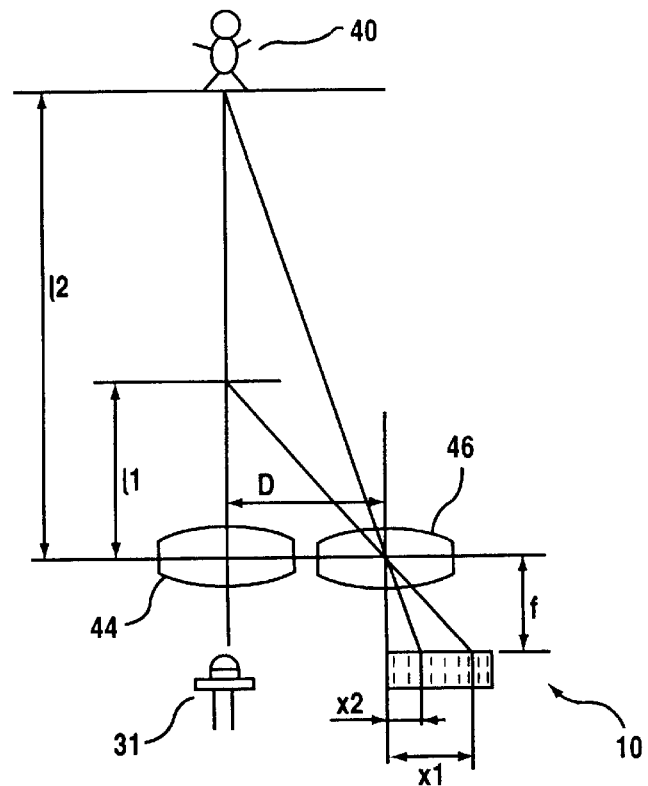
FIG. 6 is a view showing the principle of triangular distance measurement.
Figure 7:
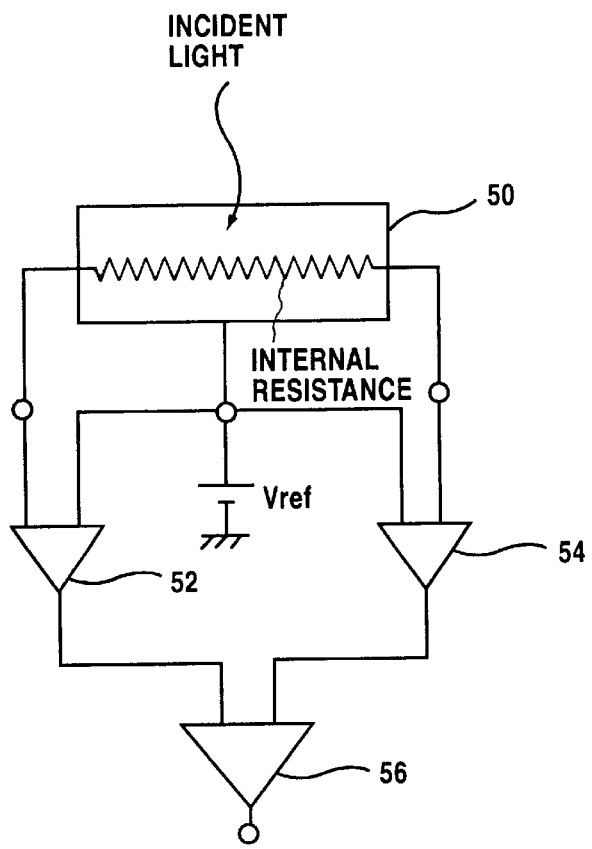
FIG. 7 is a view showing the configuration of a conventional distance sensor using a PSD.

FIG. 6 shows the principle of triangular distance measurement used for measuring a distance to a target. As shown in FIG. 6, the light emitted from the light emitting portion 31 reaches the subject 40 through a floodlighting lens 44. The light reflected by the subject 40 is condensed by a condensing lens 46 and radiated to a predetermined position of the light receiving portion 10.

If the distance from the floodlighting lens 44 to the subject 40 is $l$ ($l_1$, $l_2$), the light reflected, for example, at the distance $l_1$ enters a position separated by a distance $x_1$ from the reference position in the light receiving portion 10. On the other hand, when the subject is positioned at the distance $l_2$, the light enters a position separated by a distance $x_2$ from the reference position in the light receiving portion 10.

Assuming now that the distance between the optical axis of the floodlighting lens 44 and the optical axis of the condensing lens 46 is D and that the distance between the condensing lens 46 and the light receiving portion 10 is $f$, then the distances $x_1$ and $x_2$ in the light receiving portion 10 and the distances $l_1$ and $l_2$ up to the subject 40 have relations as shown by the following expressions, $$x_1 = D \times f / l_1 \quad (1)$$

$$x_2 = D \times f / l_2 \quad (2)$$

Accordingly, when the light-received position in the light receiving portion 10 is detected by the aforementioned method and then the aforementioned expressions are calculated on the basis of the detected position, the distance $l$ from the camera to the subject 40 can be detected with high accuracy in a short time.

As described above, according to the present invention, a plurality of light detecting elements are connected to a group of resistors respectively so that a photoelectric current generated in the light detecting elements by the light received therein is divided into parts by the resistor group. The resistor group may be formed, for example, from diffused resistors, etc., formed in one and the same substrate on which the light receiving elements are formed. Further, the resistance values of the resistors can be selected desirably. Further, it is easy to make the ratio of the resistance values of the resistors substantially equal.

Hence, in the light-received position detecting circuit according to the present invention, the configuration required for the detection of the light-received position can be formed on one chip. Accordingly, not only the wiring distance from the light receiving portion to the current detecting means can be shortened but also the circuit portion such as the current detecting means, and so on, can be shielded easily. Hence, the influence of external noise, or the like, is eliminated, so that the position detecting accuracy can be improved greatly.

Further, when the light receiving portion is divided optionally into light receiving sections by the third current detecting means, the light-received position detecting accuracy in the light receiving portion can be heightened selectively as occasion demands. Accordingly, when, for example, this light-received position detecting circuit is applied to a distance detecting apparatus, a specific distance to a target can be detected selectively with high accuracy.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A light-received position detecting circuit, comprising:
a light receiving portion in which a plurality of light detecting elements each for detecting light to generate a photoelectric current are disposed side by side;
a resistor group in which resistors are connected in series and connected to said light detecting elements respectively correspondingly for dividing a photoelectric current from said light receiving portion into photoelectric current parts in accordance with the position where the photoelectric current is generated; and
first and second current detecting means connected to opposite ends of said resistor group respectively to generate detection signals respectively in accordance with the photoelectric current parts supplied thereto through said resistor group;
wherein a light-received position of said light receiving portion is detected on the basis of said detection signals generated by said first and second current detecting means.

2. A light-received position detecting circuit according to claim 1, further comprising a third current detecting means connected to one of said resistors disposed at an intermediate portion of said resistor group to divide said light receiving portion into a plurality of light receiving sections.

3. A light-received position detecting circuit according to claim 2, wherein said third current detecting means divides said light receiving portion into a plurality of light receiving sections which are uneven in length.

4. A light-received position detecting circuit according to claim 2, further comprising a switch for desirably switching the state of said third current detecting means between detecting operation and operation stop.

5. A light-received position detecting circuit according to claim 1, wherein each of said resistors of said resistor group comprises an impurity-diffused resistor formed in a semiconductor substrate.

6. A method of detecting a light-received position using the light-received position detecting circuit defined in claim 4, said method comprising the steps of:

making said third current detecting means be in a state of said operation stop by said switch to judge a light-received region in said light receiving portion on the basis of the detection signals from said first and second current detecting means; and making said third current detecting means be in a state of said detecting operation by said switch and obtaining the light-received position of said light receiving portion on the basis of the detection signals obtained from said third current detecting means and either one of said first and second current detecting means disposed at opposite ends of a light receiving section which is one of a plurality of light receiving sections obtained by dividing said light receiving portion and to which said light-received region belongs.

7. A distance detecting apparatus using the light-received position detecting circuit defined in any one of claims 1 to 5, further comprising a light emitting portion disposed with a predetermined optical positional relation with said light receiving portion for emitting light toward a target, a light condensing means for condensing light which is emitted from said light emitting portion and returned through said target to thereby lead said light to said light receiving portion, and an arithmetic operation portion for calculating a distance from said light emitting portion to said target, wherein said distance from said light emitting portion to said target is detected by using a distance from a predetermined reference position in said light receiving portion to the light-received position in said light receiving portion and an optical distance between said light emitting portion and said condensing means.

\* \* \* \* \*